US009755600B1

(12) United States Patent
Turker Melek et al.

(10) Patent No.: US 9,755,600 B1
(45) Date of Patent: Sep. 5, 2017

(54) LINEAR GAIN CODE INTERLEAVED AUTOMATIC GAIN CONTROL CIRCUIT

(71) Applicant: Xilinx, Inc., San Jose, CA (US)

(72) Inventors: Didem Z. Turker Melek, Campbell, CA (US); Parag Upadhyaya, Los Gatos, CA (US); Kun-Yung Chang, Los Altos Hills, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/049,963

(22) Filed: Feb. 22, 2016

(51) Int. Cl.
| | |
|---|---|
| H03G 3/30 | (2006.01) |
| H03F 1/02 | (2006.01) |
| H03F 3/16 | (2006.01) |
| H04B 1/12 | (2006.01) |

(52) U.S. Cl.
CPC ......... *H03G 3/3036* (2013.01); *H03F 1/0205* (2013.01); *H03F 1/0211* (2013.01); *H03F 3/16* (2013.01); *H04B 1/123* (2013.01); *H03F 2200/555* (2013.01)

(58) Field of Classification Search
CPC .......... H03G 3/20; H03G 3/30; H03G 3/3036; H03G 3/3089; H03F 1/0205; H03F 1/02011; H03F 1/0216; H03F 1/0244; H03F 3/189; H03F 3/19; H03F 3/193; H03F 3/195; H03F 3/20; H03F 3/21; H03F 3/213; H03F 3/16; H03F 1/0211; H04B 1/123
USPC ............................ 375/345; 455/232.1, 234.1
See application file for complete search history.

(56) References Cited

U.S. PATENT DOCUMENTS

| | | | |
|---|---|---|---|
| 7,583,144 B1 | 9/2009 | Voo | |
| 8,965,317 B2 * | 2/2015 | Alavi | H03F 3/189 455/234.1 |
| 2005/0225390 A1 | 10/2005 | Klein et al. | |
| 2006/0244530 A1 | 11/2006 | Kocaman et al. | |
| 2010/0315164 A1 * | 12/2010 | Vakilian | H03F 1/086 330/254 |
| 2015/0295736 A1 | 10/2015 | Bulzacchelli et al. | |

OTHER PUBLICATIONS

Frans, Yohan et al., "A 0.5-16.3 Gb/s Fully Adaptive Flexible-Reach Transceiver for FPGA in 20 nm CMOS," IEEE Journal of Solid-State Circuits, Aug. 2015, pp. 1932-1944, vol. 50, No. 8, IEEE, Piscataway, New Jersey, USA.
Liao, Chih-Fan et al., "A 10Gb/s CMOS AGC Amplifier with 35dB Dynamic Range for 10Gb Ethernet," Digest of Technical Papers, 2006 IEEE International Solid-State Circuits Conference, Feb. 9, 2006, pp. 2092-2101, IEEE, Piscataway, New Jersey, USA.

* cited by examiner

*Primary Examiner* — Betsy Deppe
(74) *Attorney, Agent, or Firm* — Robert M. Brush

(57) ABSTRACT

An example automatic gain control (AGC) circuit includes a base current-gain circuit having a programmable source degeneration resistance responsive to first bits of an AGC code word. The AGC circuit further includes a programmable current-gain circuit, coupled between an input and an output of the base current-gain circuit, having a programmable current source responsive to second bits of the AGC code word. The AGC circuit further includes a bleeder circuit, coupled to the output of the base current-gain circuit, having a programmable current source responsive to logical complements of the second bits of the AGC code word. The AGC circuit further includes a load circuit coupled to the output of the base current-gain circuit.

20 Claims, 12 Drawing Sheets

US 9,755,600 B1

LINEAR GAIN CODE INTERLEAVED AUTOMATIC GAIN CONTROL CIRCUIT

TECHNICAL FIELD

Examples of the present disclosure generally relate to electronic circuits and, in particular, to linear gain code interleaved automatic gain control circuit.

BACKGROUND

In transceivers, an automatic gain control (AGC) block is used to attenuate or amplify an incoming analog signal such that the analog signal at its output is within the dynamic range of the sampling circuits that detect and convert the analog data into a digital bit stream. The AGC block typically includes a variable gain amplifier and a control loop that automatically adjusts the amplifier's gain.

In wireline transceivers, high loss channels will result in small signals at the receiver front end, while low loss channels will result in large signals that saturate the receiver front end. The AGC circuit, whose gain is determined through an automatic adaptation loop, attenuates large input signals and amplifies small input signals such that the signal at its output is never smaller than the sensitivity of the sampler circuit and never saturates the sampling circuit, both of which cause erroneous detection and bit errors. Accordingly, it is desirable to provide an AGC circuit with a wide gain range, high bandwidth, and good linearity with no parasitic in-band peaking across AGC gain settings.

SUMMARY

Techniques for providing a linear gain code interleaved automatic gain control (AGC) circuit are described. In an example, an AGC circuit includes a base current-gain circuit having a programmable source degeneration resistance responsive to first bits of an AGC code word. The AGC circuit further includes a programmable current-gain circuit, coupled between an input and an output of the base current-gain circuit, having a programmable current source responsive to second bits of the AGC code word. The AGC circuit further includes a bleeder circuit, coupled to the output of the base current-gain circuit, having a programmable current source responsive to logical complements of the second bits of the AGC code word. The AGC circuit further includes a load circuit coupled to the output of the base current-gain circuit.

In another example, a receiver includes an AGC circuit having a first input coupled to receive an analog signal. The receiver further includes a front-end circuit coupled to an output of the AGC circuit. The receiver further includes an AGC control circuit coupled between a second input of the AGC circuit and an output of the front-end circuit. The AGC circuit includes a base current-gain circuit coupled between the first input and the output of the AGC circuit, the base current-gain circuit having a programmable source degeneration resistance responsive to first bits of an AGC code word. The AGC circuit further includes a programmable current-gain circuit, coupled between the first input and the output of the AGC circuit, having a programmable current source responsive to second bits of the AGC code word. The AGC circuit further includes a bleeder circuit, coupled to the output of the AGC circuit, having a programmable current source responsive to logical complements of the second bits of the AGC code word. The AGC circuit further includes a load circuit coupled to the output of the AGC circuit.

In another example, a method of automatic gain control includes generating an AGC code word for controlling an AGC circuit having a base current-gain circuit, a programmable current-gain circuit, a bleeder circuit, and a load circuit. The method further includes controlling first bits of the AGC code word to control a programmable source degeneration resistance of the base current-gain circuit. The method further includes controlling second bits of the AGC code word to control a programmable current source of the programmable current-gain circuit. The method further includes logically complementing the second bits of the AGC code word to control a programmable current source of the bleeder circuit.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
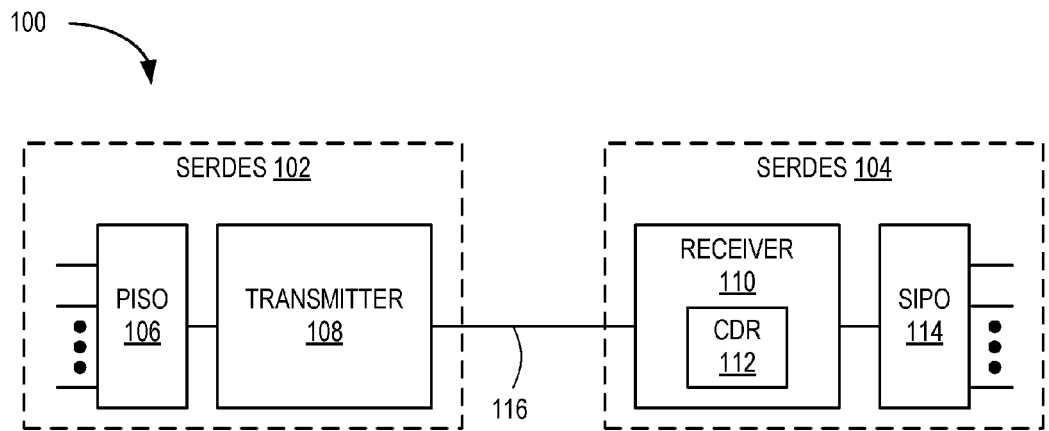
FIG. 1 is a block diagram depicting an example communication system in which examples of automatic gain control (AGC) circuit described herein can be employed.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Techniques for providing a linear gain code interleaved automatic gain control (AGC) amplifier are described. One example AGC circuit employs analog gain control through Glibert Cell-based bias current steering circuits. In another example, an AGC circuit employs a linear resistor load amplifier with source degeneration. For high-speed wireline transceivers, such an amplifier maintains linear operation while achieving a wide dynamic range with fine tuning and small gain steps. In such an amplifier, the gain is controlled by tuning source degeneration resistance, allowing the gain step from one gain control code to another to be small. Also, with source degeneration, the output swing and the input transistor current density, both of which impact linearity, are not compromised when changing gain codes.

One problem with source degeneration resistor-based gain tuning happens for wide dynamic range, high-data rate transceivers, where the AGC circuit has a wide gain range and high bandwidth. To achieve a wide dynamic range, the amplifier should have a wide range of source degeneration resistance such that the effective degeneration resistance is large for small gain (or attenuation) settings while the effective resistance is small for high gain settings. A linear resistor load amplifier with source degeneration has parasitic capacitance at the source node of the input transistors. This parasitic capacitance stems from the inherent capacitance of the transistor, as well as from wiring to the tail current source, and from the wiring of the source degeneration resistors. More source degeneration resistors results in more parasitic capacitance. The effective degeneration resistance ($R_{seff}$) and the total parasitic capacitance ($C_p$) form a parasitic zero as follows:

$$f_Z = \frac{1}{2\pi R_{seff} C_p}$$

For a high bandwidth amplifier, the parasitic zero, $f_Z$, will be in-band and cause undesired peaking in the frequency response. The parasitic peaking in the AGC frequency response is undesired for the following reasons. The peaking is parasitic-based, thus not well controlled, has a frequency dependent on the gain setting. Further, this type of peaking can cause undesired equalization where the input signal content at the peaking frequencies is boosted more than the remaining frequency content, causing inter-symbol interference (ISI). Such a boost can also cause very large signals and saturate the samplers that drive the adaptation loop and cause erroneous bit decisions. In wireline transceivers, the AGC block is often followed or preceded by a continuous time linear equalizer (CTLE) that performs equalization through peaking at desired frequencies. The role of the CTLE is to provide such boosting to target a frequency range where the peaking is often tuned. The role of the AGC, on the other hand, is to achieve a flat-response amplifier that only provides gain or attenuation. By the use of a CTLE and AGC, the job of frequency boosting and signal amplification are separated and can be controlled independently. Therefore, it can be critical to achieve a flat frequency response for each gain setting in the AGC.

One technique to reduce undesired parasitic zero peaking is to add de-peaking capacitors to the AGC output to reduce and filter the peaking that is caused by the source degeneration resistors that tune the gain and introduce parasitic peaking. These capacitors are enabled for low gain settings where large degeneration resistance causes in-band peaking and reduces the AGC bandwidth and therefore the amount of in-band peaking. At high gain settings, the capacitors are disabled such that the AGC bandwidth can be high as desired. The drawback of this technique is the need for a capacitor array and an elaborate scheme to determine how much capacitance should be enabled/disabled per each gain setting. The capacitors would also have process variations and modeling inaccuracies, both of which should be accounted for in the design, since radio frequency (RF) capacitor devices in nanometer-scale silicon technologies often require separate special models that are not as accurately controlled as transistors and resistors. Finally, adding a large capacitor array to the AGC outputs increases area and adds a lot of parasitic capacitance at the output, due to wiring and off capacitance of the unit capacitors, which will compromise the high bandwidth of the AGC.

In examples described herein, an AGC circuit is provided having gain control that does not introduce in-band parasitic peaking zeros and achieves a flat frequency response with a wide dynamic range, fine controlled gain steps, good linearity, and high bandwidth. The gain control in the AGC circuit is obtained through an interleaved combination of source degeneration resistor tuning and bias current and transconductance (gain) tuning. The AGC circuit includes modular programmable-current source-degenerated gain circuits that are enabled/disabled to change the gain. The AGC circuit further includes a bleeder circuit and a fixed-current base circuit, where gain is controlled through an array of programmable source degeneration resistors. The gain control is done in an interleaved manner between the fixed-current base circuit and the programmable gain circuits through digital gain control bits (i.e., gain code interleaving). Such interleaved control achieves accurate and wide range gain control while maintaining linearity, high bandwidth, and a flat frequency response without undesired parasitic peaking at the output. The interleaved AGC circuit also achieves constant output common mode for all gain settings through the use of the bleeder circuit that is automatically controlled through the gain control bits.

By using reduced current and smaller gain as the base to achieve the lowest gain settings, the AGC circuit described herein does not require a large degeneration resistance or a large input device in the base and therefore does not have the in-band zero problem discussed above. By using an interleaved gain control approach to increase the gain and decrease degeneration resistance, the AGC circuit achieves increased swing and increased gain, therefore good linearity, as well as a wide gain range and fine decibel (dB) linear resolution for all gain codes. These and other aspects are described further below with respect to the drawings.

FIG. 1 is a block diagram depicting an example communication system 100 in which examples of the AGC circuit described herein can be employed. The communication system 100 comprises a transmitter 108 coupled to a receiver 110 via a channel 116. In an example, the transmitter 108 is a part of a serializer/deserializer (SerDes) 102, and the receiver 110 is part of a SerDes 104. For clarity, the deserialization circuitry is omitted from the SerDes 102, and the serialization circuitry is omitted from the SerDes 104. The SerDes 102 includes a parallel-in-serial-out (PISO) circuit 106 that converts parallel input data to serial output data for transmission over the channel 116 by the transmitter 108. The SerDes 104 includes a serial-in-parallel-out (SIPO) circuit that converts serial data output by the receiver 110 to parallel output data. The SerDes 102 and the SerDes 104 can include other circuitry (not shown), such as decoders, encoders, and the like.

While the SerDes 102 and the SerDes 104 are shown, in other examples, each of the transmitter 108 and/or the receiver 110 can be a stand-alone circuit not being part of a larger transceiver circuit. In some examples, the transmitter and the receiver 110 can be part of one or more integrated circuits (ICs), such as application specific integrated circuits (ASICs) or programmable ICs, such as field programmable gate arrays (FPGAs).

The channel 116 can include an electrical transmission medium. An electrical transmission medium can be any type of electrical path between the transmitter 108 and the receiver 110, which can include metal traces, vias, cables, connectors, decoupling capacitors, termination resistors, and the like. The electrical transmission medium can be a differential signal path, such as a low-voltage differential signal (LVDS) path.

In an example, the transmitter 108 does not transmit a reference clock with the data. The receiver 110 includes a clock data recovery (CDR) circuit 112 (or CDR 112) for extracting a clock from the incoming symbol stream. The extracted clock is used to sample the incoming symbol stream and recover the transmitted bits.

Figure 2:
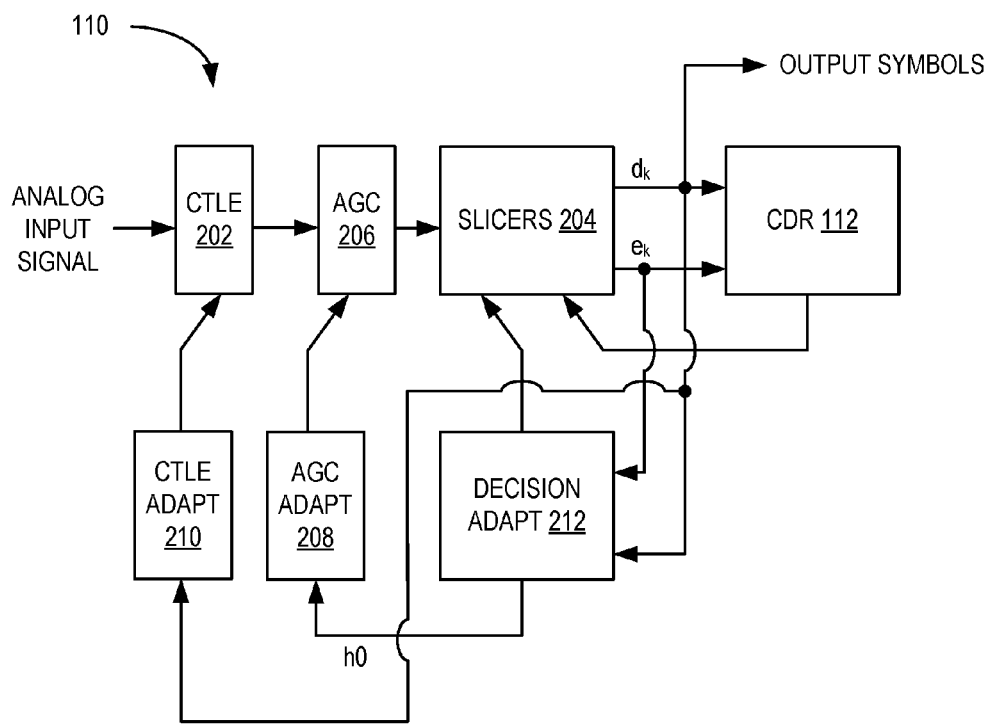
FIG. 2 is a block diagram depicting an example of a receiver in the communication system of FIG. 1.

FIG. 2 is a block diagram depicting an example of the receiver 110. The receiver 110 includes a continuous time linear equalizer (CTLE) 202, an AGC circuit 206, slicers 204, the CDR 112, an automatic gain control (AGC) adapt circuit 208, a CTLE adapt circuit 210, and a decision adapt circuit 212. The CTLE circuit 202 is coupled to receive an analog signal from the channel 116. The CTLE 202 operates as a high-pass filter to compensate for the low-pass characteristics of the channel 116. The peak of the frequency response of the CTLE 202 can be adjusted by the CTLE adapt circuit 210. The CTLE 202 outputs an equalized analog signal, which is coupled to an input of the AGC circuit 206. The AGC circuit 206 outputs a gain-adjusted signal to the slicers 204. The gain of the AGC 206 can be controlled by the AGC adapt circuit 208. In another example, the AGC circuit 206 can precede the CTLE circuit 202. In general, the output of the AGC circuit 206 can be coupled to a front-end circuit, which can include various circuits of the receiver, such as the slicers 204, CTLE 202, or the like.

The slicers 204 are coupled to the AGC circuit 206 and receives the equalized and gain-adjusted analog signal. The slicers 204 are operable to sample the equalized and gain-adjusted analog signal to generate a data sample ($d_k$) and an error sample ($e_k$) per symbol (k). The slicers 204 make symbol decisions from the equalized analog signal based on a sampling clock operating at the baud-rate. The decision adapt circuit 212 controls the decision threshold(s) of the slicer(s) 204. The CDR 112 controls the sampling phase of the slicer(s) 204. The decision adapt circuit 212 and the CDR 112 operate to minimize the values of the error samples.

The CDR 112 is coupled to the slicers 204 and receives the data and error samples. The CDR 112 generates both a timing error value and an estimated waveform value per symbol based on the data and error samples. The CDR 112 generates a control signal for adapting the sampling phase of the slicers 204 based on generated timing error values.

The decision adapt circuit 212 is coupled to the slicers 204 and receives the data and error samples. The decision adapt circuit 212 generates a control signal to control the decision threshold(s) of the slicer(s) 204 based on the data and error samples. The decision adapt circuit 212 also generates a cursor-weight ($h_0$) for the main-cursor for each processed symbol, which is coupled to the AGC adapt circuit 208. The CTLE adapt circuit 210 is coupled to the slicers 204 to receive the data samples. The CTLE adapt circuit 210 generates a control signal to adjust the peak frequency response of the CTLE 202. The AGC adapt circuit 208 is coupled to the decision adapt circuit 212 to receive the main cursor magnitude signal. The AGC adapt circuit 208 generates a control signal to adjust the gain of the AGC circuit 206. The control signal provides an AGC control word, as described further below.

Figure 3:
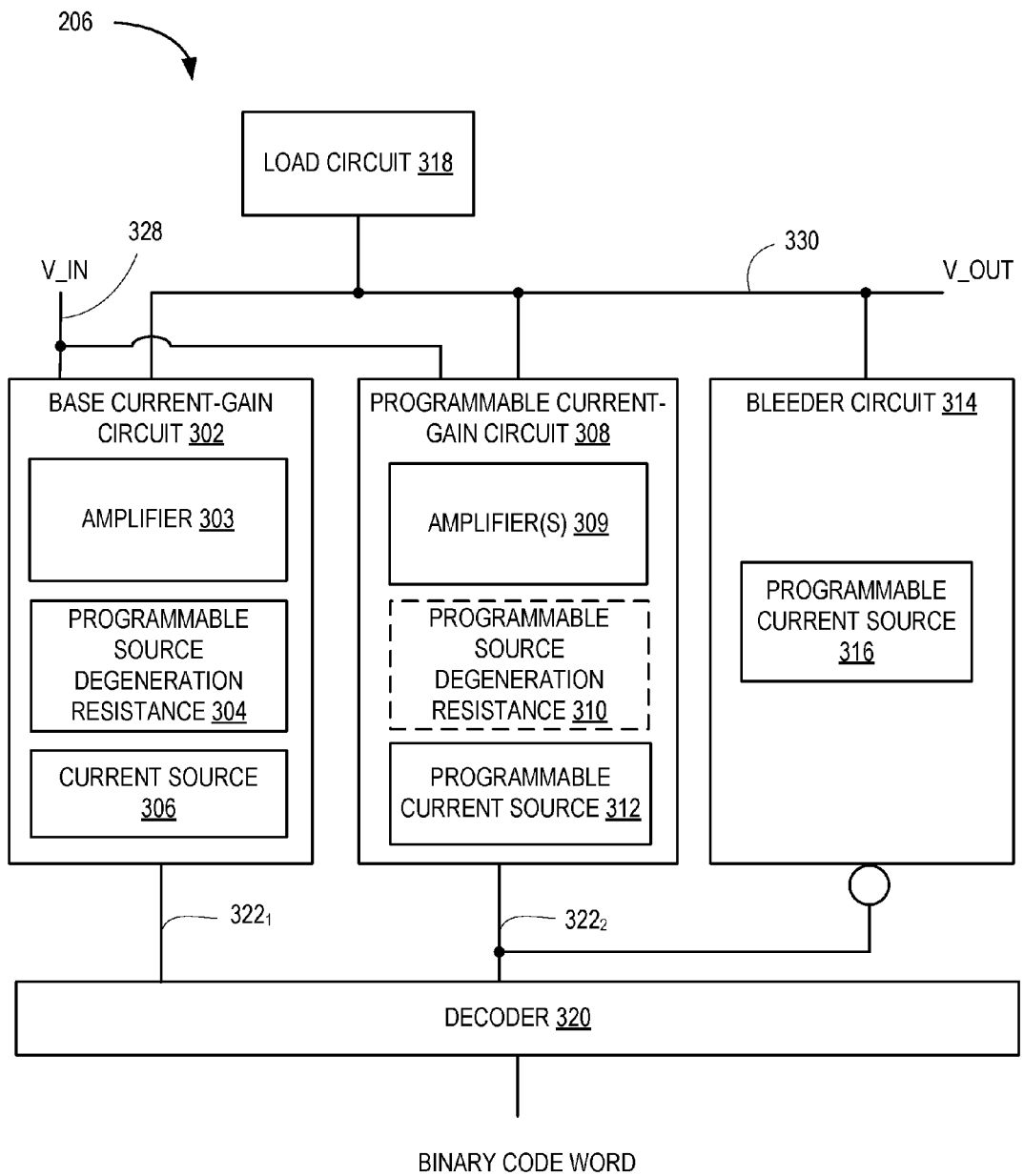
FIG. 3 is a block diagram depicting an AGC circuit according to an example.

FIG. 3 is a block diagram depicting the AGC circuit 206 according to an example. The AGC circuit 206 shown in FIG. 3 can be used in a receiver, such as the receiver 110 shown in FIG. 2 or any other type of receiver, as well as in any other type of circuit requiring automatic gain control. The AGC circuit 206 includes a base current-gain circuit 302, a programmable current-gain circuit 308, a bleeder circuit 314, and a load circuit 318. In some examples, the AGC circuit 206 further includes a decoder 320. In other examples, the decoder 320 may be part of external circuitry (e.g., the AGC adapt circuit 208).

The base current-gain circuit 302 includes an input 328 configured to receive an analog voltage (designated V_IN). The input 328 is a differential input having positive and negative components. The base current-gain circuit 302 includes an output 330 configured to provide an output analog voltage (designated V_OUT). The output 330 is a differential output having positive and negative components. The output analog voltage V_OUT can be amplified or attenuated with respect to the input analog voltage V_IN. The base current-gain circuit 302 comprises an amplifier 303 having a programmable source degeneration resistance 304 and biased by a current source 306. In an example, the current source 306 is a fixed current source (i.e., not programmable). Alternatively, in some examples, the current source 306 can be programmable. An example of the base current-gain circuit 302 is described below.

The programmable current-gain circuit 308 has an input coupled to the input 328 of the base current-gain circuit 302 and an output coupled to the output 330 of the base current-gain circuit 302. The programmable current-gain circuit 308 comprises one or more amplifiers 309 biased using a programmable current source 312. Each amplifier 309 in the programmable current-gain circuit 308 includes one or more branches of the programmable current source 312. In an example, the programmable current-gain circuit 308 also includes a programmable source degeneration resistance 310. Each amplifier 309 in the programmable current-gain circuit 308 can include one or more branches of the programmable source degeneration resistance 310. In other examples, the programmable source degeneration resistance 310 is omitted. An example of the programmable current-gain circuit 308 is described below.

The bleeder circuit 314 has an output coupled to the output 330 of the base current-gain circuit 302. The bleeder circuit 314 includes a programmable current source 316. The bleeder circuit 314 is configured to draw a programmable amount of current from the power supply (not shown), as described further below. An example of the bleeder circuit 314 is described below.

The load circuit 318 is coupled to the output 330 of the base current-gain circuit 302. The load circuit 318 is configured to convert current drawn by the base current-gain circuit 302 and the programmable current-gain circuit 308 into the output analog voltage V_OUT. Various types of load circuits can be employed, such as loads with fixed resistance, loads with programmable resistance, loads with resistance (fixed or programmable) combined with inductance for employing any type of peaking technique (e.g., shunt, series, tcoil, etc.), or the like. An example of the load circuit 318 is described below.

The decoder 320 includes an input configured to receive a binary code word (also referred to as a binary AGC code) and an output 322. The decoder 320 includes digital circuitry configured to convert the binary AGC code to a thermometer code word (variously referred to as a thermometer code, thermometer code word, AGC code, and AGC code word). That is, the decoder 320 implements a binary-to-thermometer decoder. The output 322 provides an AGC code. A first portion $322_1$ of the output 322 (also referred to as "first bits" or "degeneration resistance control bits") is coupled to the base current-gain circuit 302 to control the programmable source degeneration resistance 304. A second portion $322_2$ of the output 322 (also referred to as "second bits" or "current source control bits") is coupled to the programmable current-gain circuit 308 to control the programmable current source 312. Thus, the AGC code consists of the degeneration resistance control bits and the programmable current source control bits. A logical complement of the second portion $322_2$ of the output 322 is coupled to the bleeder circuit 314. In an example, the bleeder circuit 314 can include logical inverter circuitry for inverting the second portion $322_2$ of the output 322. Alternatively, the decoder 320 can include the logical inverter circuitry.

Figure 4A:
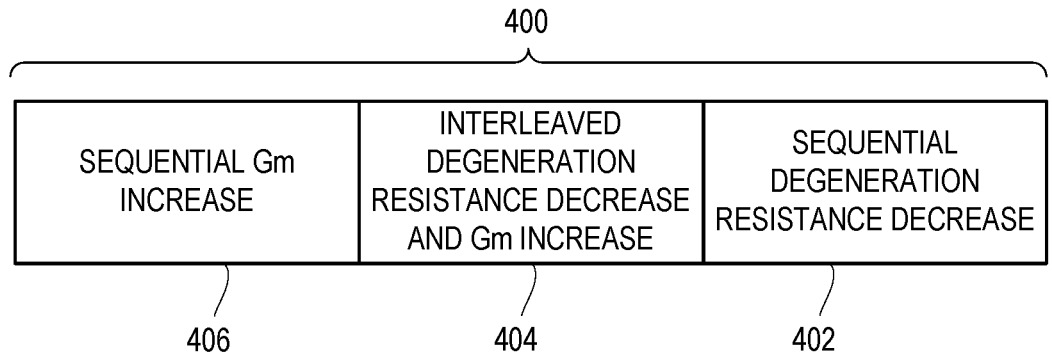
FIG. 4A is a block diagram depicting a general format of an AGC code according to an example.

FIG. 4A is a block diagram depicting a general format of an AGC code 400 output by the decoder 320 according to an example. In the example, the AGC code 400 includes a first portion 402, a second portion 404, and a third portion 406. The first portion 402 comprises least-significant bits (LSBs) (a least-significant portion) of the AGC code 400. The third portion 406 comprises most-significant bits (MSBs) (a most-significant portion) of the AGC code 400. The second portion 404 includes bits between the least-significant and most-significant bits (intervening bits or an intervening portion).

The first portion 402 of the AGC code 400 controls the programmable source degeneration resistance 304 in the base current-gain circuit 302. The first portion 402 includes only bit(s) of the first portion $322_1$ of the output 322 (only degeneration resistance control bits). Thus, the least-significant bits of the AGC code 400 provide for sequential control of the programmable source degeneration resistance 304. That is, successively setting bits in the first portion 402 decreases the programmable source degeneration resistance 304 and successively unsetting bits in the first portion 402 increases the programmable source degeneration resistance 304.

The third portion 406 of the AGC code 400 controls the programmable current source 312 in the programmable current-gain circuit 308. The third portion 406 includes only bit(s) of the second portion $322_2$ of the output 322 (only current source control bits). Thus, the most-significant bits of the AGC code 400 provide for sequential control of the programmable current source 312. That is, successively setting bits in the third portion 406 activates branches of the programmable current source 312 and successively unsetting bits in the third portion 406 deactivates branches of the programmable current source 312.

The second portion 404 of the AGC code 400 controls both the programmable source degeneration resistance 304 and the programmable current source 312. The second portion 404 includes bits of the first portion $322_1$ of the output 322 interleaved with bits of the second portion $322_2$ of the output (i.e., degeneration control bits interleaved with current source control bits). That is, the second portion 404 alternates between sets of one or more degeneration control bits and sets of one or more current source control bits. In an example, the interleaving ratio is 1:1. That is, the second portion 404 alternates between one current source control bit and one degeneration resistance control bit. Other interleaving ratios can be employed. For example, the second portion 404 can include an interleaving ratio of 2:1 (i.e., two current source control bits to one degeneration resistance control bit), 1:2 (i.e., one current source control bit to two degeneration resistance control bits), or any other ratio.

Figure 4B:
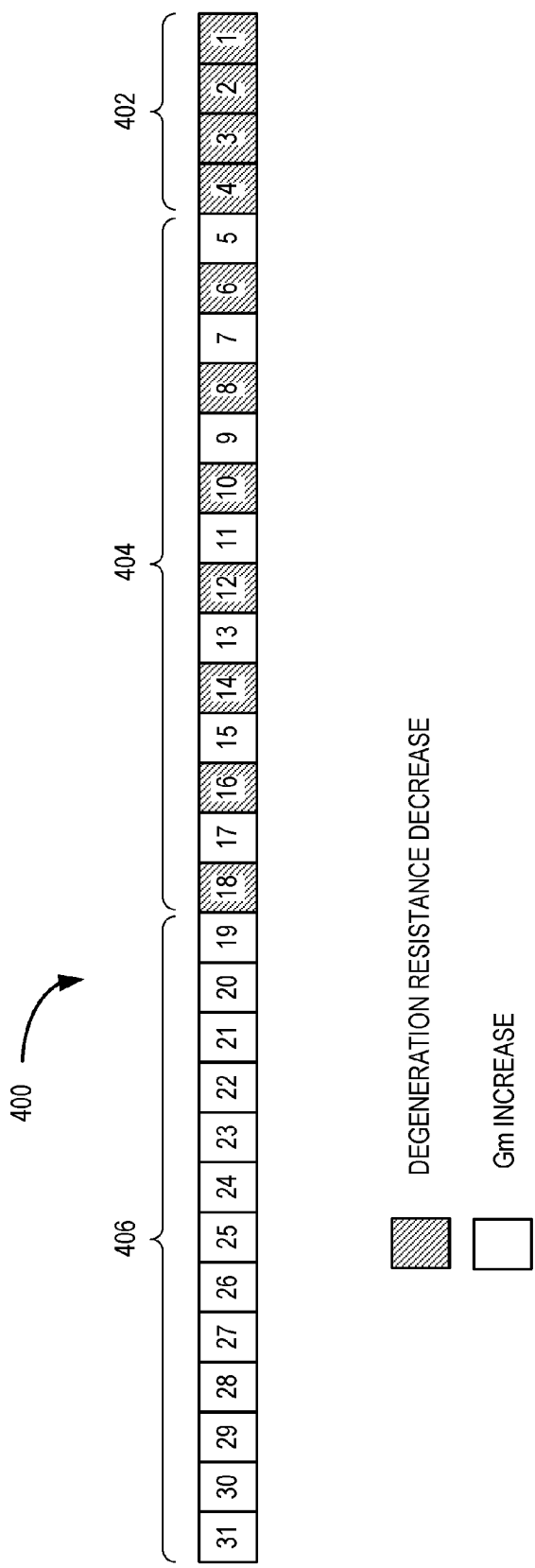
FIG. 4B is a block diagram depicting a specific example of an AGC code according to an example.

In general, the binary AGC code includes N bits, where N is a positive integer. In such case, the width of the AGC code 400 can be $2^N-1$. FIG. 4B is a block diagram depicting a specific format of the AGC code 400 according to an example where N=5. That is, the binary AGC code includes five bits and the AGC code 400 (thermometer code) includes 31 bits. In such case, there are 32 different gain settings for the AGC circuit 206. The binary word 00000 is converted to the 31-bit thermometer code 000 . . . 0; the binary word 00001 is converted to the 31-bit thermometer code 000 . . . 1; the binary word 00010 is converted to the 31-bit thermometer code 000 . . . 11; and so on until the binary word 11111 is converted to the 31-bit thermometer code 111 . . . 1. The value of N can be larger or smaller than five, depending on the required dynamic range of the AGC circuit 206 and the required resolution of each gain step.

In the example of FIG. 4B, the first portion 402 of the AGC code 400 includes four bits designated herein as AGC<1>, AGC<2>, AGC<3>, and AGC<4> (collectively AGC<4:1>). The bits AGC<4:1> of the AGC code 400 are shown with hatching to indicate that they control the programmable source degeneration resistance 304 in the base current-gain circuit 302. Bits in the AGC code 400 without hatching control the programmable current source 312 in the programmable current-gain circuit 308.

The second portion 404 of the AGC code 400 includes 14 bits designated herein as AGC<5>, AGC<6>, . . . , AGC<18> (collectively AGC<18:5>). In the example of FIG. 4B, bits in the second portion 404 alternate between increasing enabled current branches in the programmable current source 312 and decreasing source degeneration resistance in the programmable source degeneration resistance 304. Hence, the bits AGC<5>, AGC<7>, AGC<9>, AGC<11>, AGC<13>, AGC<15>, and AGC<17> control the programmable current source 312. The bits AGC<6>, AGC<8>, AGC<10>, AGC<12>, AGC<14>, AGC<16>, and AGC<18> control the programmable source degeneration resistance 304.

The third portion 406 of the AGC code 400 includes 13 bits designated herein as AGC<19>, AGC<20>, . . . , AGC<31> (collectively AGC<31:19>). The bits AGC<31:19> of the AGC code 400 are shown without hatching to indicate that they control the programmable current source 312.

Returning to FIG. 4A, the width of the first portion 402 of the AGC code 400 generally includes M bits, where M is greater than or equal to zero. Thus, in an example, M=0 and the second portion 404 becomes the least-significant bits of the AGC code 400 (i.e., the first portion 402 that provides for sequential source degeneration resistance control is omitted). In other examples, M is a positive integer. In the example of FIG. 4B, M=4.

The width of the second portion 404 depends on the number of branches of the programmable source degeneration resistance 304 and the particular interleaving ratio. In the example of FIG. 4B, the second portion 404 includes 7 bits that control the programmable source degeneration resistance 304 and hence the programmable source degeneration resistance 304 includes a total of 11 branches. Also, in the example of FIG. 4B, the second portion 404 includes a 1:1 interleaving ratio and hence the total width of the second portion is 14 bits (7 current source control bits plus 7 degeneration resistance control bits).

The width of the third portion 406 depends on the number of branches of the programmable current source 312 and the particular interleaving ratio used for the second portion 404. In the example of FIG. 4B, the third portion 406 includes 13 bits that control a respective 13 branches of the programmable current source 312. Thus, in the example of FIG. 4B, the programmable current source 312 includes a total of 20 branches (7 controlled by the second portion 404 and 13 controlled by the third portion 406). In general, the width of the third portion can be greater than or equal to zero. Thus, in an example, the third portion 406 can be omitted and the second portion 404 becomes the most-significant bits of the AGC code 400.

Referring to FIGS. 3, 4A, and 4B, gain of the AGC circuit 206 is controlled by turning on/off bits of the AGC code 400. In an example, gain control is monotonic such that the gain increases as each bit of the AGC code 400 is set. In an example, the current source 306 is a fixed current source. Within the base current-gain circuit 302, gain is controlled by turning on/off branches of the programmable source degeneration resistance 304. That is, gain can be increased by turning on branches of the programmable source degeneration resistance 304 and decreased by turning off branches of the programmable source degeneration resistance 304.

Within the programmable current-gain circuit 308, gain is controlled by turning on/off branches of the programmable current source 312. The branches of the programmable current source 312 are distributed among the amplifier(s) 309. In an example described below, each amplifier 309 includes two branches of the programmable current source 312. In other examples, each amplifier 309 can include more or less than two branches of the programmable current source 312. When a first branch of the programmable current source 312 is enabled, a first amplifier 309 is also enabled. Thus, gain is increased by increasing bias current and transconductance (Gm). As other branches of the programmable current source 312 are enabled, other amplifier(s) 309 can be enabled further increasing bias current and Gm to provide an increase in gain. If the programmable current-gain circuit 308 includes the programmable source degeneration resistance 310, then branches of the programmable source degeneration resistance 310 can be distributed among the amplifier(s) 309 similar to the branches of the programmable current source 312. Branches of the programmable source degeneration resistance 310 can be enabled as branches of the programmable current source 312 are enabled to control source degeneration resistance and the gain increase per enabled current branch.

In AGC circuits, when the gain is small, the gain step per AGC code should also be small to maintain fine grain tuning and resolution. Therefore, decibel (dB)-linear gain control is often desired for AGC circuits. In the first M AGC codes (e.g., AGC<4:1>), gain is increased by only turning on a branch of the programmable source degeneration resistance 304 in the base current-gain circuit 302. After the Mth AGC code, additional AGC codes begin enabling branches of the programmable current source 312 in the programmable current-gain circuit 308 to increase gain and the bias current. The gain control is distributed between the base current-gain circuit 302 and the programmable current-gain circuit 308 in an interleaved manner after the Mth AGC code (e.g., AGC<18:5> where M=4). This interleaved back and forth between the base current-gain circuit 302 and the programmable current-gain circuit 308 causes a bias current increase at every other AGC code (e.g., for 1:1 interleaving) and continues until all branches of the programmable source degeneration resistance 304 are enabled. In this manner, as the gain increases, the bias current increases and linearity is not compromised. The alternating between controlling the base current-gain circuit 302 and the programmable current-gain circuit 308 also provides fine and dB linear controlled AGC gain steps.

Figure 5A:
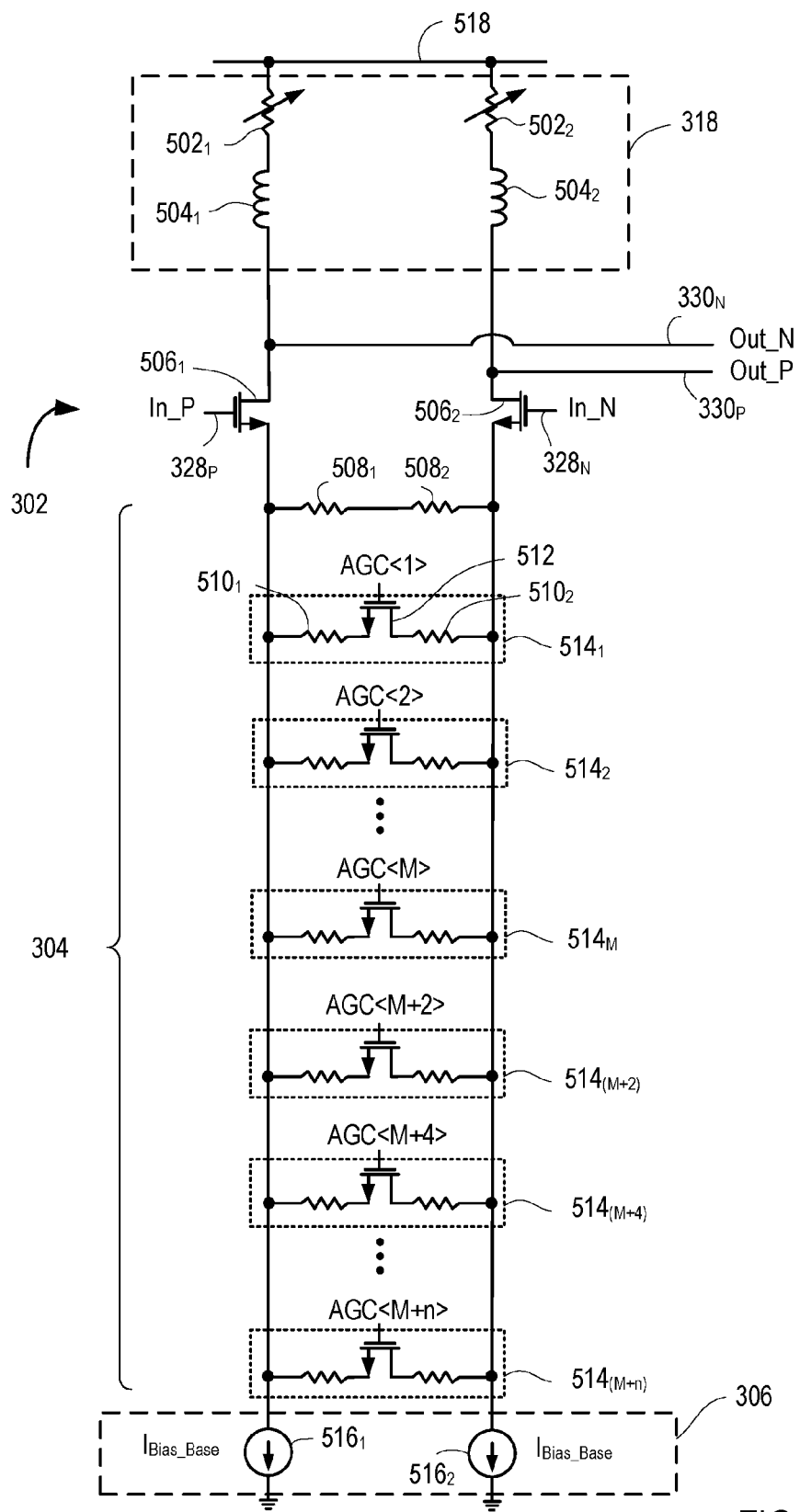
FIGS. 5A and 5B are schematic diagrams depicting examples of a base current-gain circuit.

FIG. 5A is a schematic diagram depicting the base current-gain circuit 302 according to an example. The base current-gain circuit 302 includes a transistor pair 506, a fixed resistance 508, switchable-resistance branches 514, and the current source 306. The transistor pair 506 implements the amplifier 303, and the fixed resistance 508 and the switchable-resistance branches 514 implements the programmable source degeneration resistance 304.

The transistor pair 506 includes a transistor $506_1$ and a transistor $506_2$. The transistors $506_1$ and $506_2$ are N-channel field effect transistors (FETs). For example, the transistors $506_1$ and $506_2$ can be N-type metal oxide semiconductor FETs (MOSFETs). A gate of the transistor $506_1$ is coupled to receive the positive component of the differential input voltage V_IN (designated In_P). A gate of the transistor $506_2$ is coupled to receive the negative component of the differential input voltage V_IN (designated In_N). A drain of the transistor $506_1$ is coupled to provide the negative component of the differential output voltage V_OUT (designated Out_N). A drain of the transistor $506_2$ is coupled to provide the positive component of the differential output voltage V_OUT (designated Out_P). In the example, the fixed resistance 508 includes a resistor $508_1$ coupled in series with a resistor $508_2$. A source of the transistor $506_1$ is coupled to one side of the fixed resistance 508, and a source of the transistor $506_2$ is coupled to the other side of the fixed resistance 508.

The switchable-resistance branches 514 include a plurality of branches $514_1$ to $514_M$ and $514_{(M+2)}$, $514_{(M+4)}$, ..., $514_{(M+n)}$. The switchable-resistance branches 514 are coupled in parallel with each other and with the fixed resistance 508. In an example, each switchable-resistance branch 514 includes a resistor $510_1$, a transistor 512, and a resistor $510_2$ coupled in series. A source and drain of the transistor 512 are coupled to the resistor $510_1$ and the resistor $510_2$, respectively. A gate of the transistor 512 is coupled to receive a bit of the AGC code 400. The branch $514_1$ receives the bit AGC<1>, the branch $514_M$ receives the bit AGC<M>, and so on until the branch $514_{(M+n)}$ receives the bit AGC<M+n>. The switchable-resistance branches 514 can include other configurations. For example, each switchable-resistance branch can include a resistor coupled between a pair of transistors.

The current source 306 includes a first current source $516_1$ and a second current source $516_2$. The first current source $516_1$ is coupled between the source of the transistor $506_1$ and a reference voltage (e.g., electrical ground). The second current source $516_2$ is coupled between the source of the transistor $506_2$ and the reference voltage. Each current source $516_1$ and $516_2$ sinks a current designated $I_{Bias\_Base}$.

FIG. 5A also shows an example of the load circuit 318. In the example, the load circuit 318 includes inductors $504_1$ and $504_2$ and programmable resistors $502_1$ and $502_2$. The inductor $504_1$ is coupled in series with the programmable resistor $502_1$, and the inductor $504_2$ is coupled in series with the programmable resistor $502_2$. The series combination of the inductor $504_1$ and the programmable resistor $502_1$ is coupled between a supply voltage 518 and the drain of the transistor $506_1$. The series combination of the inductor $504_2$ and the programmable resistor $502_2$ is coupled between the supply voltage 518 and the drain of the transistor $506_2$. The programmable resistors 502 can be programmed to account for process and temperature variations (PVT). The inductors 504 provide inductive peaking. As discussed above, the load circuit 318 can have other configurations.

In operation, when the AGC code 400 is zero (i.e., none of AGC<31:1> are set), the programmable source degeneration resistance 304 includes only the fixed resistance 508. Thus, the source degeneration resistance is at its highest value. The bias current is equal to $I_{Bias\_Base}$, which is the lowest bias current of the AGC circuit 206. Since this gain setting is low, the swing that is needed for linearity is also low. Thus, using a smaller bias current does not compromise linearity. As the AGC code 400 increases (e.g., more bits of the AGC code 400 are set), more of the switchable-resistance branches 514 are enabled, decreasing the source degeneration resistance and increasing gain of the AGC circuit 206.

When the AGC code reaches (M+n), all of the branches of the programmable source degeneration resistance 304 are enabled. For AGC codes greater than (M+n), each AGC code turns on a branch of the programmable current source 312, which provides more bias current, until the maximum AGC code is reached (e.g., AGC<31> in the example of FIG. 4B). The number of switchable-resistance branches 514 depends on design specifications. For higher gain codes, a larger gain step is preferred to keep a constant gain step over gain ratio (constant gain step in dBs). Therefore, at larger gain codes, the programmable source degeneration resistance 304 is not adjusted. Rather, only the programmable current-gain circuit 308 is adjusted, which achieves larger gain steps. This also keeps the size of the programmable source degeneration resistance 304 small, reducing parasitic capacitance. In the example of FIG. 4B, M=4, which means interleaving begins at AGC code M+1=5. Depending on design specifications, M can be larger than four or as small as 1 such that interleaving begins right away for the lowest AGC codes.

Figure 5B:
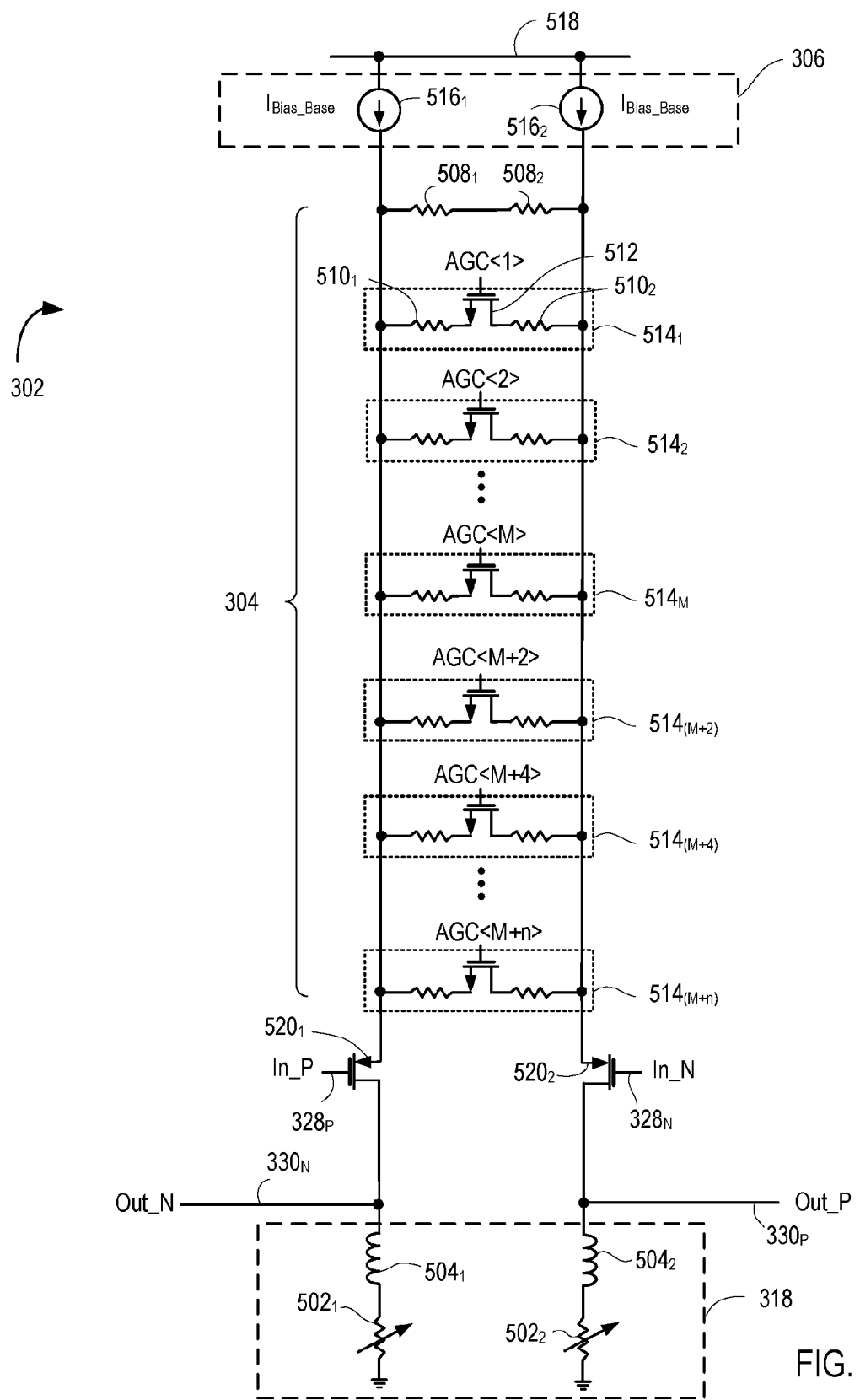

FIG. 5B is a schematic diagram depicting the base current-gain circuit 302 according to another example. Elements in FIG. 5B that are the same or similar to those of FIG. 5A are designated with identical reference numerals. In the example of FIG. 5B, the transistors of the amplifier 303 comprise P-channel FETs, such as P-type MOSFETs. That is, the base current-gain circuit 302 includes a transistor pair 520 comprising a transistor $520_1$ and a transistor $520_2$. Sources of the transistors $520_1$ and $520_2$ are coupled to respective terminals of the fixed resistance 508 and the switchable-resistance branches 514. Drains of the transistors $520_1$ and $520_2$ are coupled to the load circuit 318. Gates of the transistors $520_1$ and $520_2$ receive the voltages In_P and In_N, respectively. The base current-gain circuit 302 shown in FIG. 5B operates similarly to the example shown in FIG. 5A discussed above.

Figure 6:
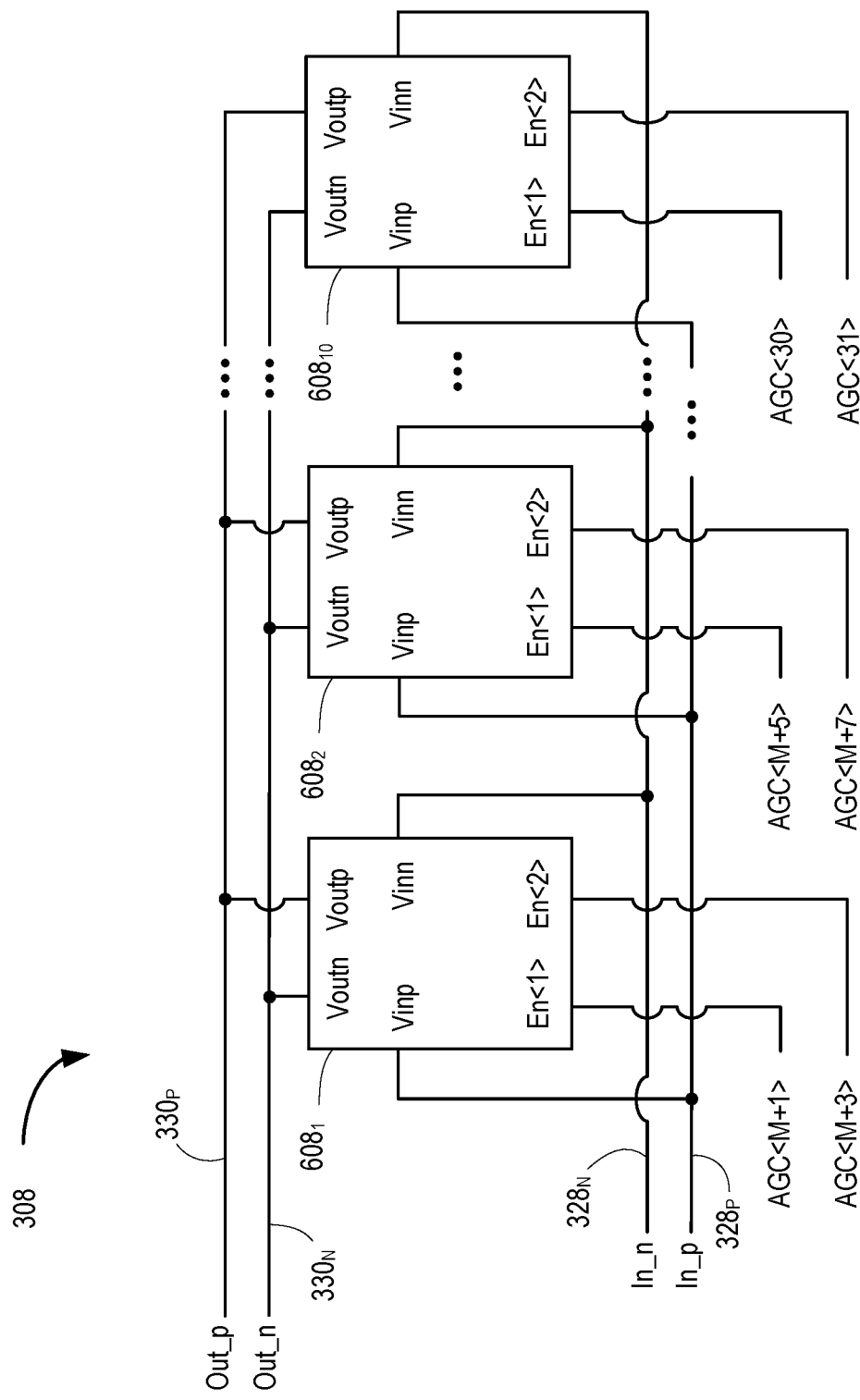
FIG. 6 is a block diagram depicting a programmable current-gain circuit according to an example.

FIG. 6 is a block diagram depicting the programmable current-gain circuit 308 according to an example. The programmable current-gain circuit 308 includes a plurality of current-gain cells 608. In the present example, the programmable current-gain circuit 308 includes 10 current-gain cells $608_1$ through $608_{10}$. In other examples, the programmable current-gain circuit 308 can include more or less current-gain cells 608. Each current-gain cell 608 includes a differential input (Vinp and Vinn) and a differential output (Voutn and Voutp). The differential input of each current-gain cell 608 is coupled to a differential input $328_P$ and $328_N$. The differential output of each current-gain cell 608 is coupled to a differential output $330_P$ and $330_N$.

Each current-gain cell 608 includes one or more enable inputs for enabling a respective one or more branches of the programmable current source 312. In the present example, each current-gain cell 608 includes two enable inputs designated En<1> and En<2>. The enable inputs En<1> and En<2> of the current-gain cell $608_1$ are coupled to receive respective bits AGC<M+1> and AGC<M+3> of the AGC code 400; the enable inputs En<1> and En<2> of the current-gain cell $608_2$ are coupled to receive respective bits AGC<M+5> and AGC<M+7>; and so on until the current-gain cell $608_{10}$ are coupled to receive respective bits AGC<30> and AGC<31>.

The example of the programmable current-gain circuit 308 shown in FIG. 6 corresponds to the example AGC code 400 shown in FIG. 4B. As shown in FIG. 4B, the AGC code 400 includes 20 bits configured to control branches of the programmable current source 312. In the example of FIG. 6, the programmable current-gain circuit 308 includes 10 current-gain cells each having two enable inputs for a total of 20 enable inputs for respectively controlling the 20 branches of the programmable current source 312. One current-gain cell 608 is enabled for every two branches of the programmable current source 312 that are enabled. In other examples, there can be more or less than 10 current-gain cells. Further, in other examples, each current-gain cell 608 can have more or less enable inputs.

Figure 7:
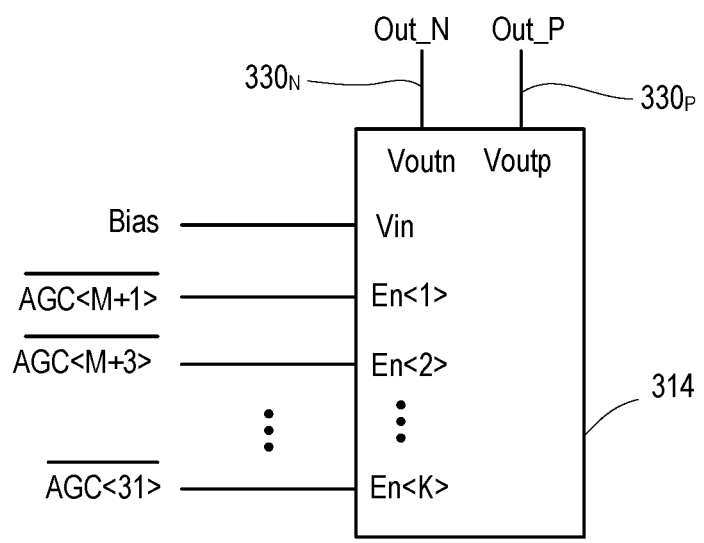
FIG. 7 is a block diagram depicting a bleeder circuit according to an example.

FIG. 7 is a block diagram depicting the bleeder circuit 314 according to an example. The bleeder circuit 314 includes an input (Vin) coupled to receive a bias voltage. The bleeder circuit 314 includes a differential output (VoutN, Voutp) coupled to the differential output $330_N$ and $330_P$. The bleeder circuit 314 includes a plurality of enable inputs En<1> through En<K>, where K equals the number of bits in the AGC code 400 that control the programmable current source 312. In the example of FIG. 4B, the AGC code 400 includes 20 bits configured to control the programmable current source 312 and thus in that example K=20. Each of the enable inputs is configured to receive a logical complement of a bit of the AGC code 400. Specifically, the enable input En<1> receives the logical complement of AGC<M+1>, the enable input En<2> receives the logical complement of AGC<M+3> and so on until the enable input En<K> receives the logical complement of AGC<31> (where K=20). Each enable input is configured to enable a branch of the programmable current source 316.

In operation, the programmable current source 316 includes the same number of branches as the programmable current source 312. A branch of the programmable current source 316 is disabled for each branch of the programmable current source 312 that is enabled. In the example of FIG. 4A, from AGC codes 0 to M all current-gain cells 608 are off (no branches of the programmable current source 312 are enabled) and all branches of the programmable current source 316 are on. From AGC codes M+1 through 31, a branch of the programmable current source 316 is disabled for each code. In this manner, the total DC current drawn by the AGC circuit 206 will remain constant leading to a fixed common mode. When the total DC current drawn by the AGC circuit 206 is constant, the bias current that affects the gain of the AGC circuit 206 changes with AGC code through enabling and disabling current-gain cells 608. This is because the bleeder circuit 314 is not coupled to the input signal V_IN, but rather coupled to receive a separate input bias signal. Thus, the current drawn by the bleeder circuit 314 impacts only common mode, not the signal gain.

Figure 8A:
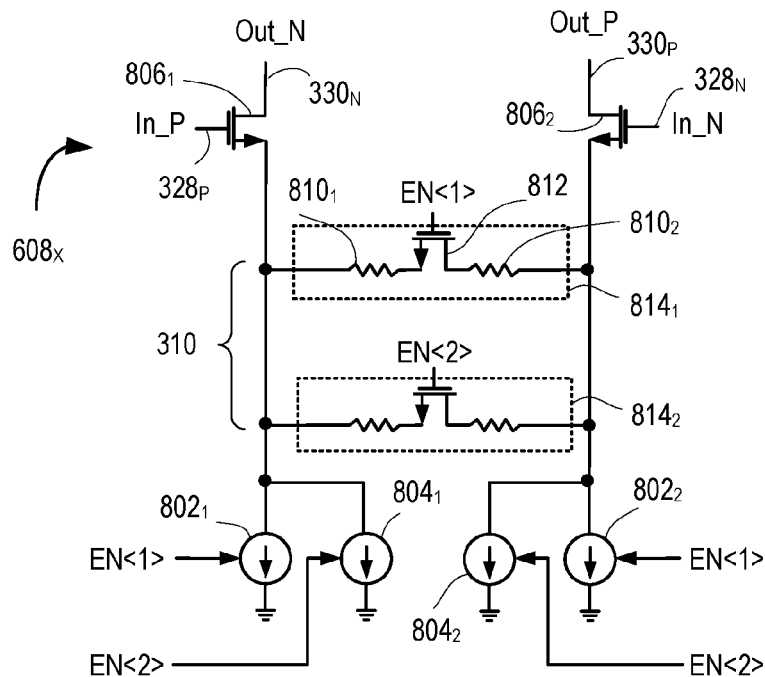
FIGS. 8A-8D are schematic diagrams depicting examples of a current-gain cell.

FIGS. 8A-8D are schematic diagrams depicting examples of a current-gain cell 608. As shown in FIG. 8A, the current-gain cell 608 includes a transistor pair 806 comprising a transistor $806_1$ and a transistor $806_2$. The transistors $806_1$ and $806_2$ comprise N-channel FETs (e.g., N-type MOSFETs). Drains of the transistors $806_1$ and $806_2$ are coupled to the outputs $330_N$ and $330_P$, respectively. Gates of the transistors $806_1$ and $806_2$ are coupled to the inputs $328_P$ and $328_N$, respectively.

In the example of FIG. 8A, the current-gain cell 608 includes branches $814_1$ and $814_2$ of the programmable source degeneration resistance 310. Each branch $814_1$ includes a resistor $810_1$, a transistor 812, and a resistor $810_2$ coupled in series. The branches 814 are coupled in parallel between sources of the transistors $806_1$ and $806_2$. The gate of the transistor 812 in the branch $814_1$ receives the enable signal En<1> and the gate of the transistor 812 in the branch $814_2$ receives the enable signal En<2>.

In the example of FIG. 8A, the current-gain cell 608 includes two branches of the programmable current source 312 designated as branch 802 and branch 804. The branch 802 is enabled through the enable signal En<1> and the branch 804 is enabled through the enable signal En<2>. The branch 802 includes a current source $802_1$ coupled between the source of the transistor $806_1$ and the reference voltage, and a current source $802_2$ coupled between the source of the transistor $806_2$ and the reference voltage. The branch 804 includes a current source $804_1$ in parallel with the current source $802_1$ and a current source $804_2$ in parallel with the current source $802_2$.

In operation, if both enable signals are unset, then the current-gain cell 608 is disabled. If the enable signal En<1> is set, the branch 802 of the programmable current source 312 and the branch $814_1$ of the programmable source degeneration resistance 310 are enabled. If both the enable signals En<1> and En<2> are set, both branches 802 and 804 of the programmable current source 312, and both branches $814_1$ and $814_2$ of the programmable source degeneration resistance 310, are enabled. When enabled, the current-gain cell 608 increases gain by increasing bias current and effectively increasing the input transistor size (i.e., increasing Gm). The gain of the current-gain cell 608 is linearly added to the gain of the base current-gain circuit 302. Turning on a current-gain cell 608 is similar to increasing the bias current and the effective width of the input transistor of an amplifier circuit.

Figure 8B:
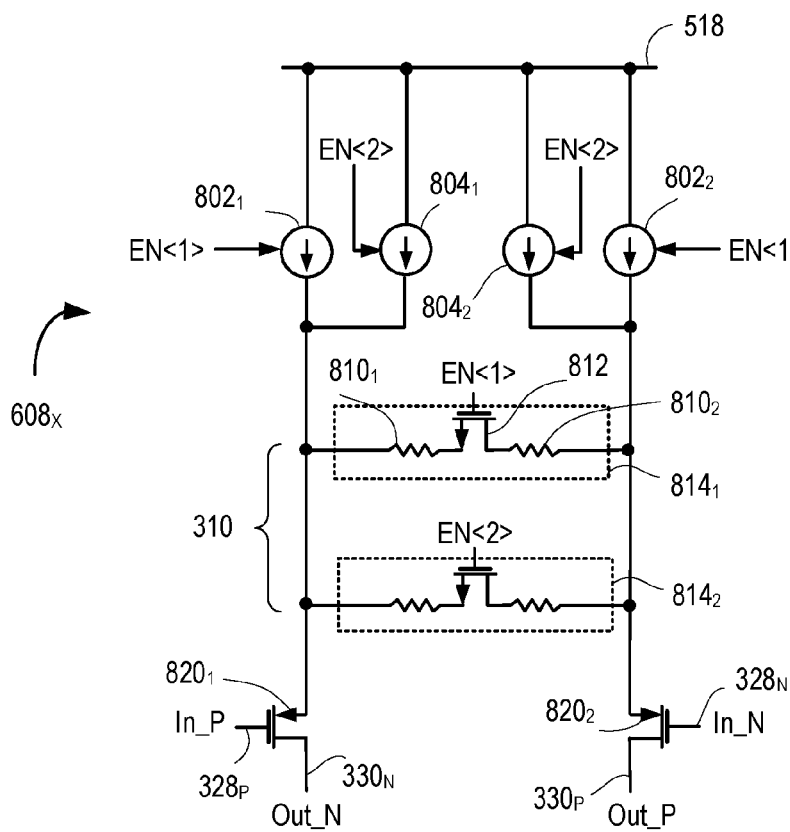

Elements in FIG. 8B that are the same or similar to those of FIG. 8A are designated with identical reference numerals. In the example of FIG. 8B, the N-channel transistors are replaced with P-channel transistors (e.g., P-type MOSFETs). That is, the current-gain cell 608 includes transistors $820_1$ and $820_2$ configured similarly to the transistors $806_1$ and $806_2$ described above. The branches 802 and 804 of the programmable current source 312 are coupled between sources of the transistors $820_1$ and $820_2$ and the voltage supply 518. The current-gain cell 608 shown in FIG. 8B operates similarly as described above.

Figure 8C:
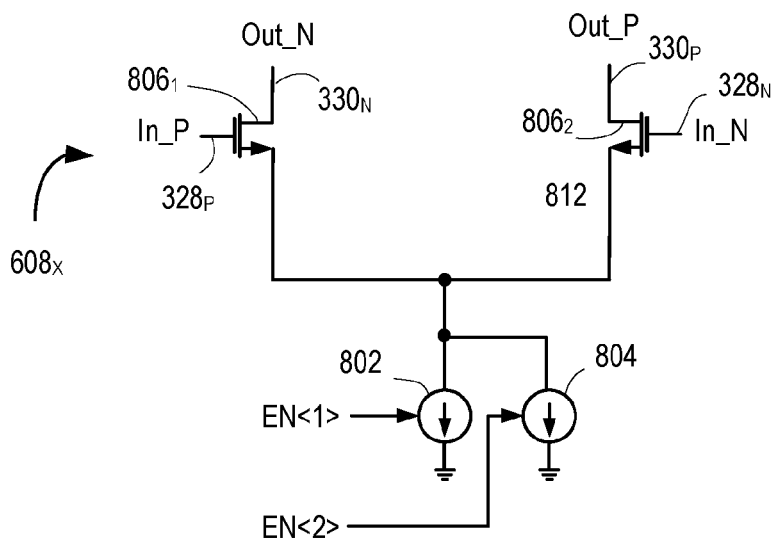

Elements in FIG. 8C that are the same or similar to those of FIG. 8A are designated with identical reference numerals. In the example of FIG. 8C, the programmable source degeneration resistance 310 is omitted. The sources of the transistors $806_1$ and $806_2$ are coupled together. The branches 802 and 804 of the programmable current source 312 are coupled in parallel between the sources of the transistors $806_1$ and $806_2$ and the reference voltage. The current-gain cell 608 shown in FIG. 8C operates similarly as described above, but without the source degeneration resistance.

Figure 8D:
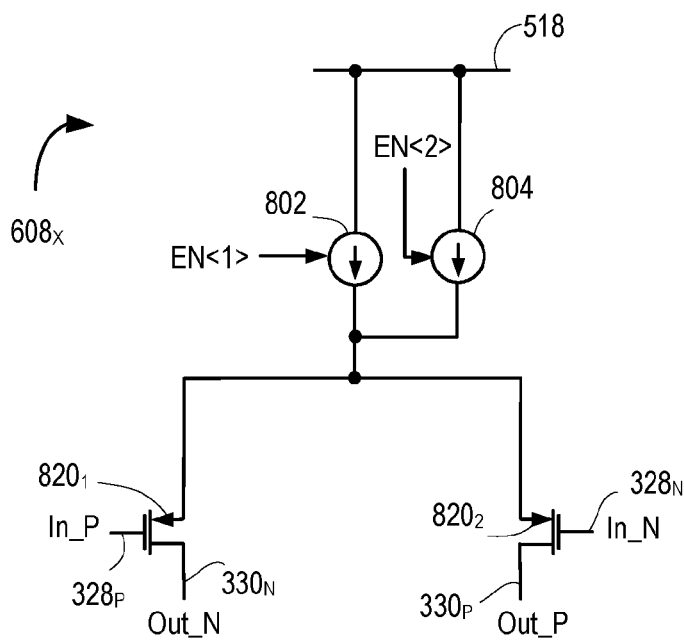

Elements in FIG. 8D that are the same or similar to those of FIG. 8B are designated with identical reference numerals. In the example of FIG. 8D, the programmable source degeneration resistance 310 is omitted. The sources of the transistors $820_1$ and $820_2$ are coupled together. The branches 802 and 804 of the programmable current source 312 are coupled in parallel between the sources of the transistors $820_1$ and $820_2$ and the supply voltage 518. The current-gain cell 608 shown in FIG. 8D operates similarly as described above, but without the source degeneration resistance.

Figure 9A:
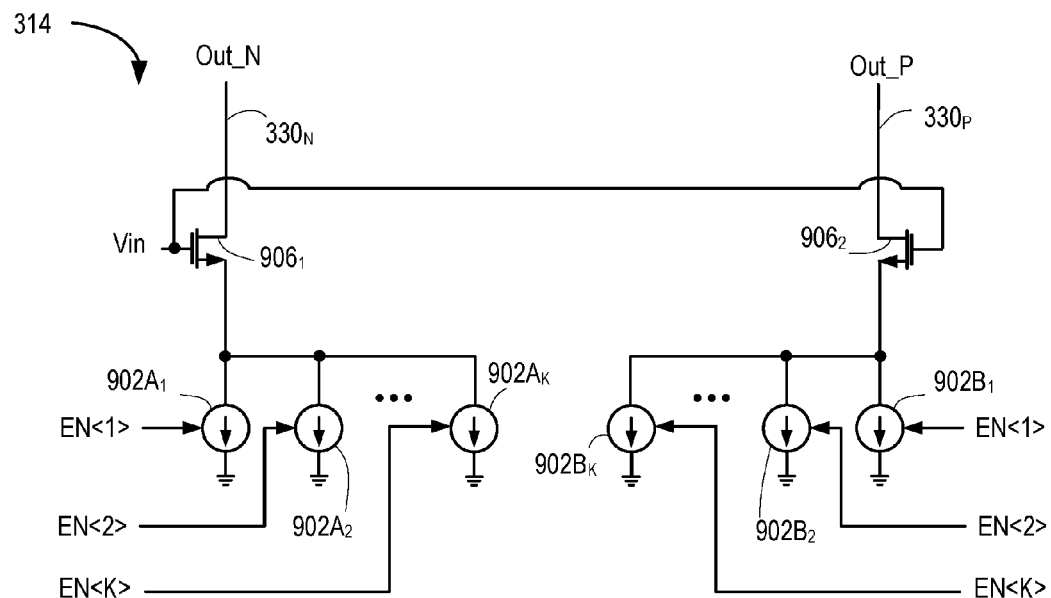
FIGS. 9A-B are schematic diagrams depicting a bleeder circuit according to examples.

FIG. 9A is a schematic diagram depicting the bleeder circuit 314 according to an example. The bleeder circuit 314 includes a transistor pair 906 comprising a transistor $906_1$ and a transistor $906_2$. Drains of the transistors $906_1$ and $906_2$ are coupled to the outputs $330_N$ and $330_P$, respectively. Gates of the transistors $906_1$ and $906_2$ are coupled to receive a bias voltage Vin. The programmable current source 316 includes K branches $902_1$ through $902_K$ corresponding with the K enable signals En<1> through En<K>, respectively. Each branch includes a pair of current sources (labeled A and B). Thus, the branch $902_1$ includes current sources $902A_1$ and $902B_1$; the branch $902_2$ includes current sources $902A_2$ and $902B_2$; and so on until the branch $902_K$ includes the current sources $902A_K$ and $902B_K$. The current sources 902A are coupled between the source of the transistor $906_1$ and the reference voltage. The current sources 902B are coupled between the source of the transistor $906_2$ and the reference voltage. The current sources 902A are coupled in parallel, and the current sources 902B are coupled in parallel. Operation of the bleeder circuit 314 is described above. FIG. 9 shows just one example of the bleeder circuit 314. The bleeder circuit 314 can have various configurations. In general, the bleeder circuit 314 includes one or more cells each having one or more branches of the programmable current source 316. Each cell can be constructed using N-channel transistors as shown in FIG. 9, or constructed using P-channel transistors in configurations similar to the current-gain cell 608 shown in FIGS. 8B and 8D.

Figure 9B:
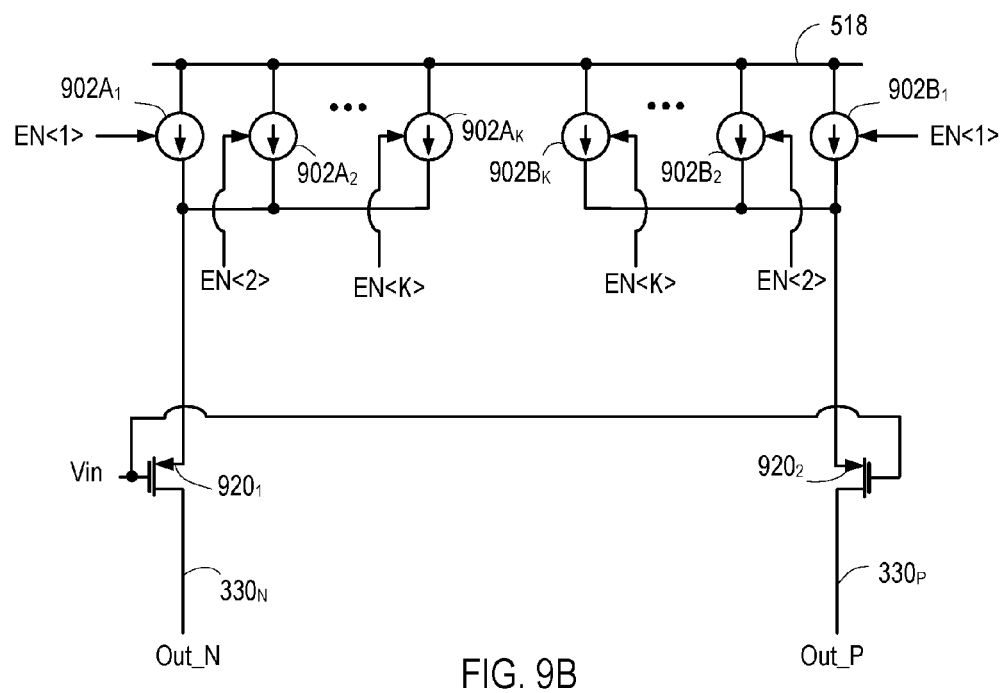

FIG. 9B is a schematic diagram depicting the bleeder circuit 314 according to another example. Elements that are the same or similar to those of FIG. 9A are designated with identical reference numerals and described above. In the present example, the N-channel transistors 906 are replaced with P-channel transistors 920 (e.g., P-type MOSFETs). That is, the bleeder circuit 314 can include a P-channel transistor $920_1$ and a P-channel $920_2$ in place of N-channel transistor $906_1$ and N-channel transistor $906_2$. The current sources 902 are coupled between the supply voltage 518 and the sources of the P-channel transistors 920.

Figure 10:
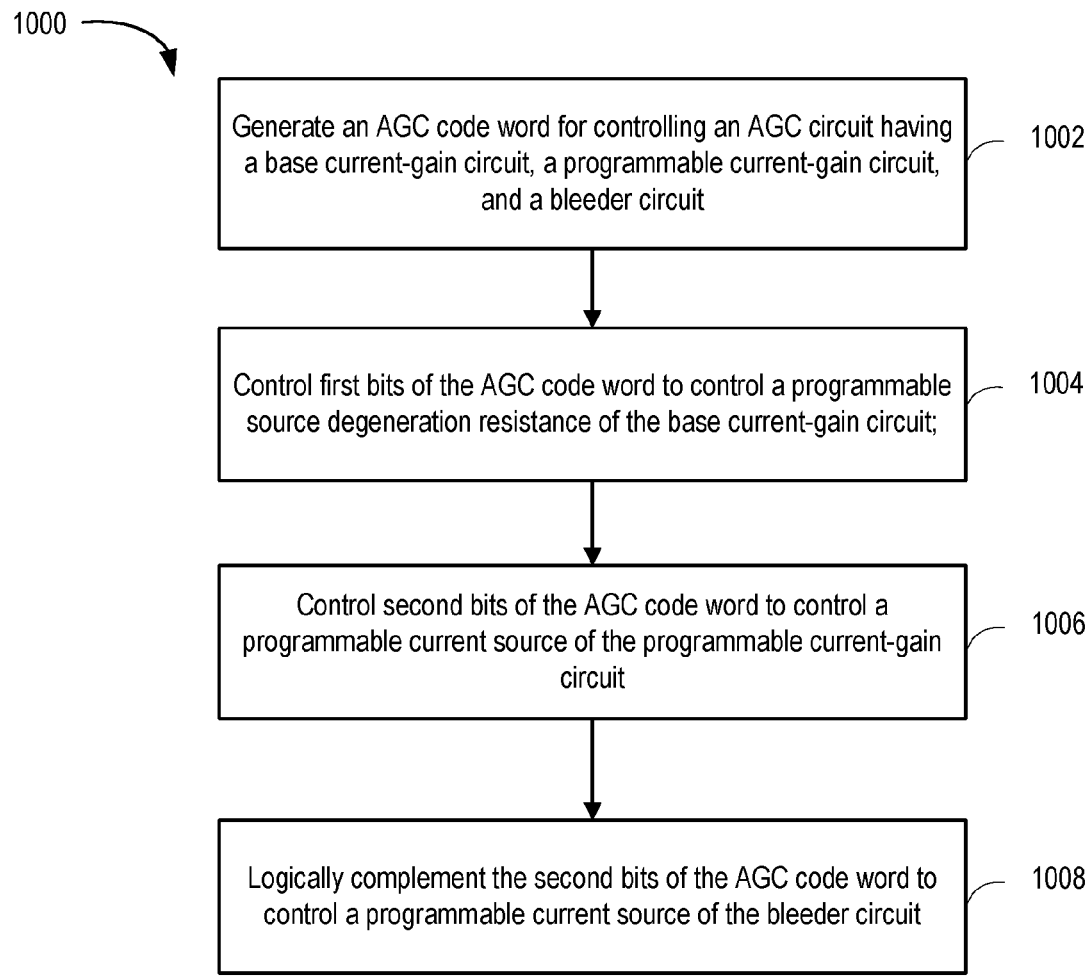
FIG. 10 is a flow diagram depicting a method of automatic gain control according to an example.

FIG. 10 is a flow diagram depicting a method 1000 of automatic gain control according to an example. The method 1000 can be performed by the AGC circuit 206 described above and summarizes the operation described above. The method 1000 begins at step 1002, where the decoder 320 is controlled to generate an AGC code word for controlling the AGC circuit 206 having the base current-gain circuit 302, the programmable current-gain circuit 308, and the bleeder circuit 314. Example AGC code words are shown in FIGS. 4A and 4B described above.

At step 1004, the decoder 320 is controlled to have first bits of the AGC code word control the programmable source degeneration resistance 304 of the base current-gain circuit. In the example of FIG. 4A, the first bits referred to in step 1004 comprise all of the bits within the first portion 402 and some of the bits in the second portion 404. In the example of FIG. 4B, the first bits referred to in step 1004 comprise AGC<4:1> and AGC<6>, AGC<8>, . . . , AGC<18>.

At step 1006, the decoder 320 is controlled to have second bits of the AGC code word control the programmable current source 312 of the programmable current-gain circuit 308. In the example of FIG. 4A, the second bits referred to in step 1006 comprise all of the bits within the third portion 406 and some of the bits in the second portion 404. In the example of FIG. 4B, the second bits referred to in step 1006 comprise AGC<31:19> and AGC<5>, AGC<7>, . . . , AGC<17>.

At step 1008, the decoder 320 or the bleeder circuit 314 logically complements the second bits of the AGC code word to control the programmable current source 316.

Figure 11:
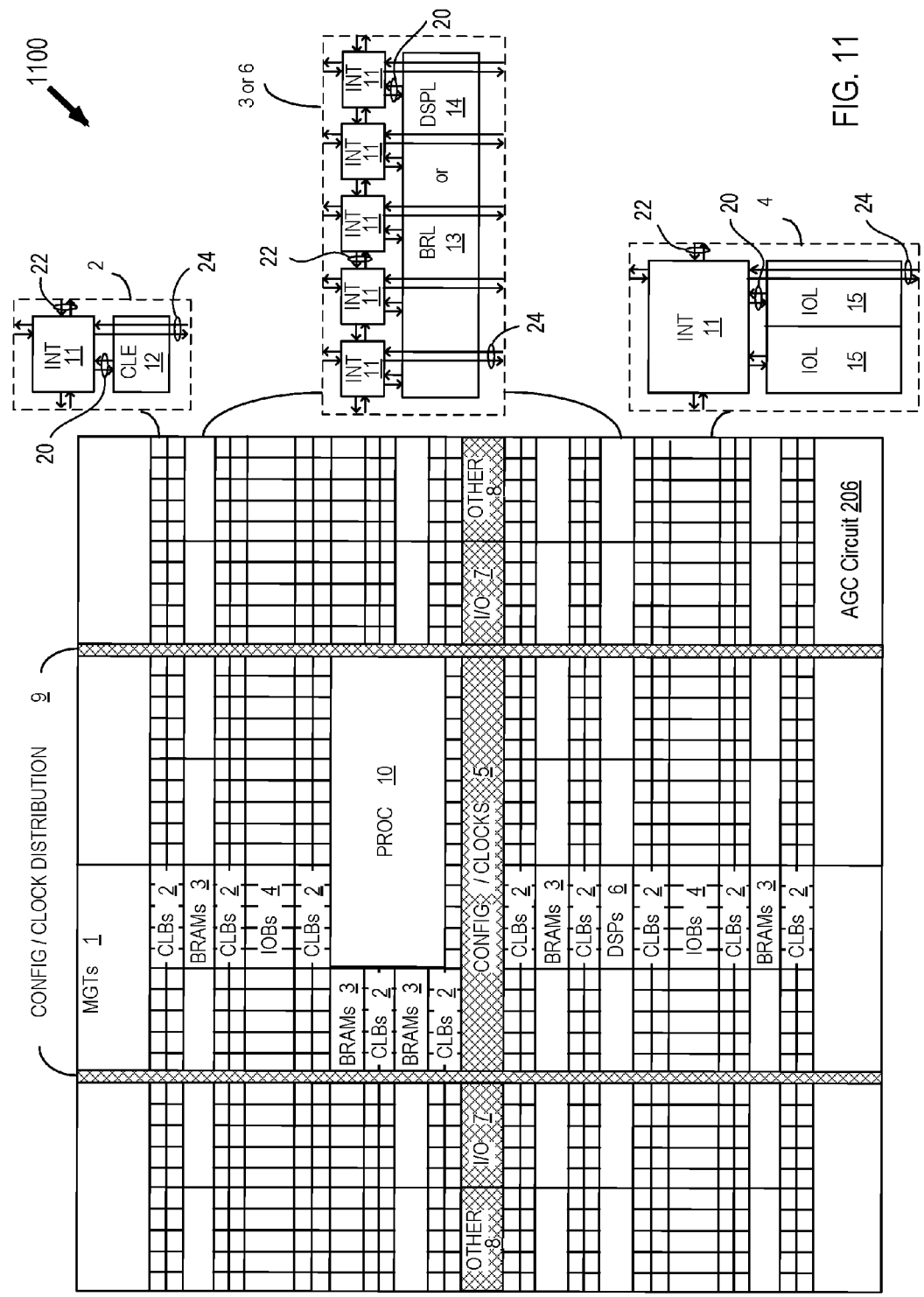
FIG. 11 illustrates an architecture of a field programmable gate array (FPGA) that can include an AGC circuit as described herein.

The AGC circuit 206 described herein can be used in serial receivers or transceivers disposed in an IC, such as a field programmable gate array (FPGA) or other type of programmable IC. FIG. 11 illustrates an architecture of an FPGA 1100 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10.

In some FPGAs, each programmable tile can include at least one programmable interconnect element ("INT") 11 having connections to input and output terminals 20 of a programmable logic element within the same tile, as shown by examples included at the top of FIG. 11. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 11) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 11 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 11 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 11 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Techniques for providing a linear-interleaved AGC circuit have been described. The design achieves a wide dynamic range with a flat frequency response. The wide dynamic range is achieved by using smaller bias current and smaller transistor size for the current source and the transistor pair of the base current-gain circuit 302 and for the lowest AGC gain codes. For larger AGC gain codes, more bias current is enabled and more transistors are coupled to the input to increase the effective width of the input transistors. Therefore, the effective degeneration resistance required to achieve the smallest gain does not have to be large and the parasitic capacitance contributed by the input transistors and from the resistor array wiring is not large. This leads to a high frequency zero that is out of the target bandwidth and can always be kept out of band by adjusting the parameters M, n, and the number of current-gain cells 608 in the programmable current-gain circuit 308. Further, the AGC circuit design achieves linearity throughout all gain codes due to the interleaving between the base and programmable circuits. As gain codes increase, more bias current is added, increasing the swing along with the gain such that the signal is never clipped by limited swing. The design achieves constant output common mode through the use of the bleeder circuit 314 that is controlled by the AGC gain codes and automatically turns on/off DC current sources to make sure the output common mode is constant for all AGC codes.

The AGC circuit 206 described above can include several variations. In the examples described above, to ensure monotonous behavior, gain is always added and never subtracted for increasing AGC codes. Each AGC code increase either turns on a resistor branch in the base or enables a current-gain cell, both of which always increases the gain. However, to make the gain step size per code smaller, gain could be subtracted from the base and added through enabling the current-gain cells in the programmable current-gain circuit 308 such that the different between the two is the effective gain increase. For example, a resistor branch in the programmable source degeneration resistance 304 can be disabled when a given current-gain cell 608 in the programmable current-gain circuit 308 is enabled. Gain would still be monotonous with AGC code if the subtracted gain is always smaller than the added gain.

In another example, the current source 306 in the base current-gain circuit 302 can be made larger for even more linearity at smaller gain codes. Some of the base current provided by the current source 306 can be turned off when current-gain cells are enabled in the programmable current-gain circuit 308 so that the total bias current is not too high. This is similar to the above approach, where some gain is subtracted from the base current-gain circuit 302 and added by the programmable current-gain circuit 308 so that the total gain increases with increasing AGC code. In such a variation, the current source 306 can be programmable rather than fixed.

In another example, the current source 306 in the base current-gain circuit 302 can be programmable and can be tuned along with the branches of the programmable source degeneration resistance 304. That is, branch(es) of the current source 306 can be enabled/disabled when branch(es) of the programmable source degeneration resistance 304 are enabled/disabled.

Further, as described above, the number of branches in the programmable source degeneration resistance 304, the number of AGC code steps, the number of current-gain cells 608, the number of branches of the programmable current source 312, and the number of branches of the programmable current source 312 per current-gain cell 608 can be different than in the examples described above and can depend on specific design requirements.

While the foregoing is directed to specific examples, other and further examples may be devised without departing from the basic scope thereof, and the scope thereof is determined by the claims that follow.

What is claimed is:

1. An automatic gain control (AGC) circuit, comprising:
a base current-gain circuit having a programmable source degeneration resistance responsive to first bits of an AGC code word;
a programmable current-gain circuit, coupled between an input and an output of the base current-gain circuit, having a programmable current source responsive to second bits of the AGC code word;
a bleeder circuit, coupled to the output of the base current-gain circuit, having a programmable current source responsive to logical complements of the second bits of the AGC code word; and
a load circuit coupled to the output of the base current-gain circuit.

2. The AGC circuit of claim 1, wherein the base current-gain circuit comprises a fixed current source.

3. The AGC circuit of claim 1, wherein the programmable current-gain circuit comprises a programmable source degeneration resistance responsive to the second bits of the AGC code word.

4. The AGC circuit of claim 1, wherein the programmable current-gain circuit comprises a plurality of current gain cells each providing at least one branch of the programmable current source.

5. The AGC circuit of claim 1, wherein a portion of the AGC code word consists of a first plurality of the first bits interleaved with a first plurality of the second bits.

6. The AGC circuit of claim 5, wherein a least-significant portion of the AGC code word consists of a second plurality of the first bits.

7. The AGC circuit of claim 5, wherein a most-significant portion of the AGC code word consists of a second plurality of the second bits.

8. The AGC circuit of claim 1, wherein the programmable source degeneration resistance of the base current-gain circuit comprises:
a fixed resistance; and
a plurality of switchable resistances in parallel with the fixed resistance.

9. The AGC circuit of claim 1, wherein the base current-gain circuit comprises a programmable current source responsive to the first bits of the AGC code word.

10. The AGC circuit of claim 1, further comprising:
a decoder configured to generate the AGC code word as a thermometer code from a binary code word.

11. A receiver, comprising:
an automatic gain control (AGC) circuit having a first input coupled to receive an analog signal;
a front-end circuit coupled to an output of the AGC circuit; and
an AGC control circuit coupled between a second input of the AGC circuit and an output of the front-end circuit;
wherein the AGC circuit includes:
a base current-gain circuit coupled between the first input and the output of the AGC circuit, the base current-gain circuit having a programmable source degeneration resistance responsive to first bits of an AGC code word;
a programmable current-gain circuit, coupled between the first input and the output of the AGC circuit, having a programmable current source responsive to second bits of the AGC code word;
a bleeder circuit, coupled to the output of the AGC circuit, having a programmable current source responsive to logical complements of the second bits of the AGC code word; and
a load circuit coupled to the output of the AGC circuit.

12. The receiver of claim 11, wherein the programmable current-gain circuit comprises a plurality of current gain cells each providing at least one branch of the programmable current source.

13. The receiver of claim 11, wherein a portion of the AGC code word consists of a first plurality of the first bits interleaved with a first plurality of the second bits.

14. The receiver of claim 13, wherein a least-significant portion of the AGC code word consists of a second plurality of the first bits.

15. The receiver of claim 13, wherein a most-significant portion of the AGC code word consists of a second plurality of the second bits.

16. The receiver of claim 11, wherein the AGC circuit further includes:
a decoder configured to generate the AGC code word as a thermometer code from a binary code word output by the AGC control circuit.

17. A method of automatic gain control (AGC), comprising:
generating an AGC code word for controlling an AGC circuit having a base current-gain circuit, a programmable current-gain circuit, a bleeder circuit, and a load circuit;
setting first bits of the AGC code word to control a value of a programmable source degeneration resistance of the base current-gain circuit;

setting second bits of the AGC code word to control a current supply by a programmable current source of the programmable current-gain circuit; and logically complementing the second bits of the AGC code word to control a programmable current source of the bleeder circuit.

18. The method of 17, wherein a portion of the AGC code word consists of a first plurality of the first bits interleaved with a first plurality of the second bits.

19. The method of claim 18, wherein a least-significant portion of the AGC code word consists of a second plurality of the first bits.

20. The method of claim 18, wherein a most-significant portion of the AGC code word consists of a second plurality of the second bits.

* * * * *